US011576279B2

(12) United States Patent
Chen et al.

(10) Patent No.: US 11,576,279 B2
(45) Date of Patent: Feb. 7, 2023

(54) HEAT DISSIPATION DEVICE

(71) Applicant: AURAS TECHNOLOGY CO., LTD., New Taipei (TW)

(72) Inventors: Chih-Wei Chen, New Taipei (TW); Cheng-Ju Chang, New Taipei (TW); Jyun-Wei Huang, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/371,280

(22) Filed: Jul. 9, 2021

(65) Prior Publication Data

US 2022/0018611 A1 Jan. 20, 2022

Related U.S. Application Data

(60) Provisional application No. 63/053,953, filed on Jul. 20, 2020, provisional application No. 63/084,681, filed on Sep. 29, 2020.

(51) Int. Cl.
| | | |
|---|---|---|
| *H05K 7/20* | (2006.01) | |
| *F28D 15/04* | (2006.01) | |
| *F28D 15/02* | (2006.01) | |
| *F28F 1/22* | (2006.01) | |
| *F28F 1/32* | (2006.01) | |

(52) U.S. Cl.
CPC ......... *H05K 7/202* (2013.01); *F28D 15/0275* (2013.01); *F28D 15/04* (2013.01); *F28D 15/046* (2013.01); *F28F 1/22* (2013.01); *F28F 1/325* (2013.01); *F28D 15/0283* (2013.01)

(58) Field of Classification Search
CPC ..... H05K 7/202; F28D 15/0275; F28D 15/04; F28D 15/046; F28D 15/0283; F28F 1/22; F28F 1/325
See application file for complete search history.

(56) References Cited

U.S. PATENT DOCUMENTS

| | | | | |
|---|---|---|---|---|
| 5,253,702 | A * | 10/1993 | Davidson ............ | F28D 15/0266 29/890.032 |
| 6,714,413 | B1 * | 3/2004 | Ghosh ................. | F28D 15/0266 361/698 |
| 6,738,257 | B1 * | 5/2004 | Lai ........................... | F28F 1/32 174/15.2 |
| 7,509,996 | B2 * | 3/2009 | Peng ......................... | F28F 1/32 165/104.21 |
| 2008/0115914 | A1 * | 5/2008 | Yang ..................... | H01L 23/467 165/104.33 |
| 2008/0314556 | A1 * | 12/2008 | Zhou ................... | F28D 15/0266 165/104.33 |
| 2011/0127012 | A1 * | 6/2011 | Ma ........................ | H01L 23/467 165/104.34 |
| 2012/0002373 | A1 * | 1/2012 | Kitajima .................. | F28F 1/32 361/717 |
| 2017/0356694 | A1 * | 12/2017 | Tan ..................... | F28D 15/0266 |
| 2020/0315064 | A1 * | 10/2020 | Agostini ............. | F28D 15/0233 |

\* cited by examiner

*Primary Examiner* — Tho V Duong

(74) *Attorney, Agent, or Firm* — Amin, Turocy & Watson, LLP

(57) ABSTRACT

A heat dissipation device is provided and includes a vapor chamber unit, a heat pipe set provided on an outer surface of the vapor chamber unit, a first fin set provided on the outer surface of the vapor chamber unit and sleeving the heat pipe set, and a second fin set stacked on the first fin set and sleeving the heat pipe set, where the fin arrangement direction of the first fin set is different from the fin arrangement direction of the second fin set.

13 Claims, 4 Drawing Sheets

HEAT DISSIPATION DEVICE

BACKGROUND

1. Technical Field

The present disclosure relates to the heat dissipation field, and more specifically, to a heat dissipation device with a vapor chamber and fin sets.

2. Description of Related Art

In the face of modernization, computers and various other electronic devices have seen rapid developments and continuously improved performance. However, along with these improvements, heat dissipation has become one of the major issues faced by high performance hardware today. In general, computers and electronic devices employ heat dissipation components for dissipating the heat away. For example, a thermal paste or cooling fins can be attached onto an electronic component that is subjected to heat dissipation in order to absorb and disperse heat generated by the electronic component. However, heat dissipation effect provided by this type of heat dissipation method is rather limited. Heat dissipation components that use phase changes of working fluids for heat transfer have thus been developed.

The heat dissipation components achieve heat transfer typically by utilizing the phase changes and directions of flow of working fluids. However, when faced with the high heat generated by high power processors, heat cannot be dissipated effectively, resulting in poor heat dissipation efficiency.

Therefore, there is an urgent need in the art to provide a heat dissipation device that addresses the aforementioned shortcomings of the prior art.

SUMMARY

The present disclosure provides a heat dissipation device, which includes: a vapor chamber unit; a heat pipe set provided on an outer surface of the vapor chamber unit; a first fin set provided on the outer surface of the vapor chamber unit and sleeving the heat pipe set; and a second fin set stacked on the first fin set and sleeving the heat pipe set, wherein an arrangement direction of fins of the first fin set is different from an arrangement direction of fins of the second fin set.

In the aforementioned heat dissipation device, the heat pipe set includes a plurality of first heat pipes and a plurality of second heat pipes, wherein the plurality of first heat pipes are provided on the outer surface on two opposite ends of the vapor chamber unit, and the plurality of second heat pipes are provided on the outer surface between the two opposite ends of the vapor chamber unit.

In the aforementioned heat dissipation device, the first fin set includes a plurality of holes penetrating through two sides of the first fin set to sleeve the plurality of first heat pipes and the plurality of second heat pipes, wherein a cross-sectional area of each of the holes is greater than a cross-sectional area of a pipe body of each of the plurality of first heat pipes or each of the plurality of second heat pipes.

In the aforementioned heat dissipation device, heights of the plurality of first heat pipes extending from the outer surface are greater than heights of the plurality of second heat pipes extending from the outer surface.

In the aforementioned heat dissipation device, the first fin set partially covers and partially exposes the plurality of first heat pipes and the plurality of second heat pipes.

In the aforementioned heat dissipation device, the second fin set further includes a second primary fin set and a second secondary fin set stacked on the second primary fin set, wherein the second primary fin set completely covers portions of the plurality of second heat pipes exposed from the first fin set, and partially covers and partially exposes portions of the plurality of first heat pipes, and wherein the second secondary fin set partially or completely covers the portions of the plurality of first heat pipes exposed from the second primary fin set.

In the aforementioned heat dissipation device, each of the plurality of first heat pipes or the plurality of second heat pipes includes a pipe body and a closed end and an open end at two opposite ends of the pipe body, wherein at least one connector is provided on the outer surface of the vapor chamber unit for connecting with the open end.

The aforementioned heat dissipation device further includes a chamber formed inside the vapor chamber unit, and an internal pipe space formed inside the pipe body, wherein the internal pipe space is in communication with the chamber through the open end and the connector.

The aforementioned heat dissipation device further includes a capillary structure located in the internal pipe space and extends into the chamber via an inner side of the connector.

In the aforementioned heat dissipation device, the capillary structure includes a first segment and a second segment, wherein the first segment is located in the internal pipe space, and the second segment is formed by bending and extending one end of the first segment and is located in the chamber.

The aforementioned heat dissipation device further includes a working fluid filled in the chamber and the internal pipe space, wherein the working fluid is guided by the capillary structure to flow in the capillary structure.

In the aforementioned heat dissipation device, the open end extends axially along and radially outwards from the pipe body, such that an aperture of the open end is greater than an aperture of the connector, wherein a conical space is formed between the open end, the connector and the outer surface once the open end is connected to the connector and contacting the outer surface of the vapor chamber unit.

The aforementioned heat dissipation device further includes a solder joint filled in the conical space to seal a junction between the open end and the connector.

In the aforementioned heat dissipation device, the vapor chamber unit and the heat pipe set are integrally formed.

In the aforementioned heat dissipation device, a thickness of the first fin set extending from the outer surface of the vapor chamber unit is greater or less than a thickness of the second fin set stacked on the first fin set.

DETAILED DESCRIPTION OF THE EMBODIMENTS

Embodiments of the present disclosure are illustrated with specific implementations. Other advantages and technical effects of the present disclosure can be readily understood by one with ordinary skills in the art upon reading the disclosure provided herein, and can be used or applied in other different implementations.

Figure 1:
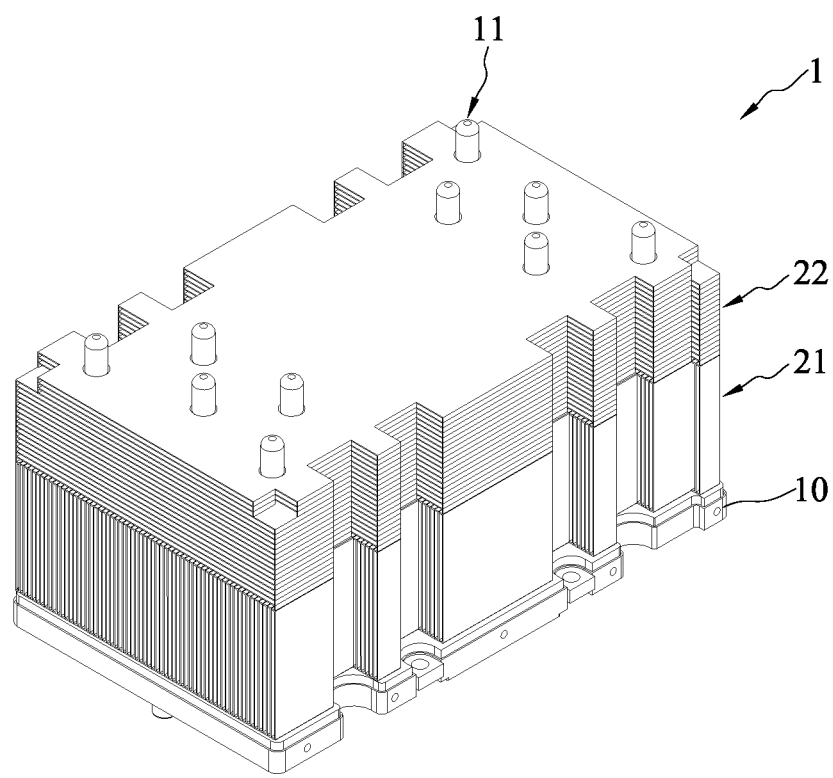
FIG. 1 is a schematic overall view of a heat dissipation device in accordance with the present disclosure.
Figure 2:
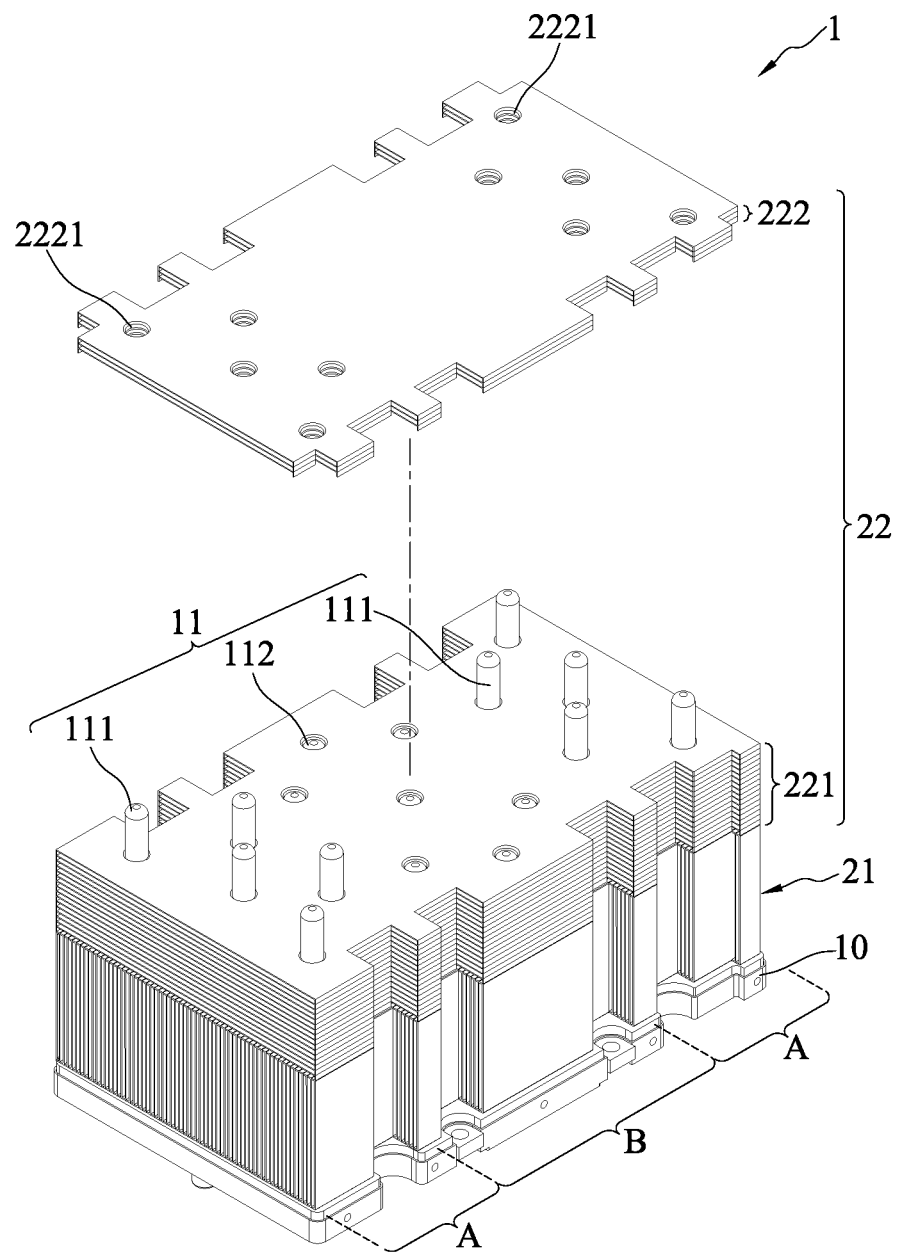
FIG. 2 is a schematic exploded view of the heat dissipation device in accordance with the present disclosure.
Figure 3:
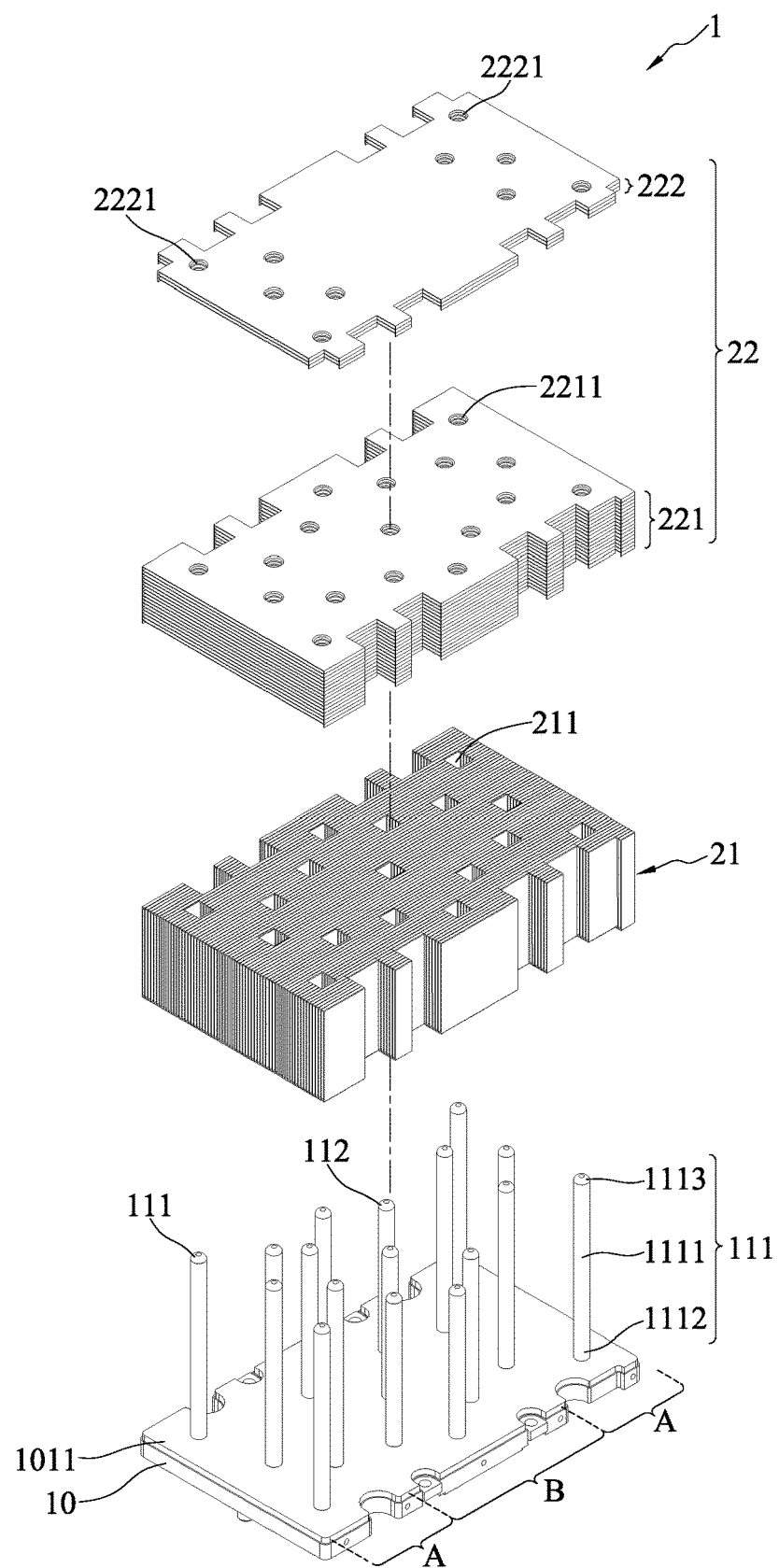
FIG. 3 is another schematic exploded view of the heat dissipation device in accordance with the present disclosure.

Referring to FIGS. 1, 2 and 3, a heat dissipation device 1 in accordance with the present disclosure includes a vapor chamber unit 10, a heat pipe set 11, a first fin set 21 and a second fin set 22. The heat pipe set 11 is provided on an outer surface 1011 of the vapor chamber unit 10. The first fin set 21 is provided on the outer surface 1011 of the vapor chamber unit 10 and sleeved the heat pipe set 11 and partially exposing the heat pipe set 11. The second fin set 22 is stacked on the first fin set 21 and sleeved the heat pipe set 11 exposed by the first fin set 21 and partially exposing the heat pipe set 11. In an embodiment, the overall form factors of the first fin set 21 and the second fin set 22 can approximate the outer surface 1011 of the vapor chamber unit 10, such that the outer surface 1011 of the vapor chamber unit 10 can be completely covered. However, the present disclosure is not limited to as such. In addition, a fin set described herein refers to a structure that is composed of a plurality of fins arranged at intervals. The technical content of the fin sets and the associations with the heat pipe set is described as follows.

In an embodiment, the outer surface 1011 of the vapor chamber unit 10 is defined with two side regions A at two opposite ends of the outer surface 1011 and a middle region B between the two opposite ends. The heat pipe set 11 can include a plurality of first heat pipes 111 and a plurality of second heat pipes 112, wherein the plurality of first heat pipes 111 are arranged on the two side regions A, and the plurality of second heat pipes 112 are arranged on the middle region B. The plurality of first heat pipes 111 and the plurality of second heat pipes 112 are arranged at intervals to one another. In an embodiment, the number of the first heat pipes 111 provided on each of the side regions A is five, whereas the number of the second heat pipes 112 provided on the middle region B is seven, but the present disclosure is not limited as such and the quantities can be adjusted depending on the needs. Furthermore, the arrangements and the locations of the first heat pipes 111 and the second heat pipes 112 can be designed by taking the uniformity of temperature distribution into consideration. As such, the present disclosure is not limited to the arrangements and the locations illustrated in FIGS. 1 to 3.

In an embodiment, the first heat pipes 111 and the second heat pipes 112 respectively extend from the outer surface 1011 in a direction that is away from the outer surface 1011 (e.g., perpendicular to the outer surface 1011), and the directions of extensions of the first heat pipes 111 and the second heat pipes 112 are parallel to each other, but the present disclosure is not limited to as such. In another embodiment, the extension height of the first heat pipes 111 from the outer surface 1011 is higher than the extension height of the second heat pipes 112 from the outer surface 1011, but the present disclosure is not limited to as such. In addition, the first heat pipes 111 and the second heat pipes 112 can be heat dissipation components in the form of heat pipes with cross-sectional shapes of circles, ovals or polygons, but the present disclosure is not limited to as such.

In an embodiment, the first fin set 21 includes a plurality of holes 211 penetrating through two sides of the first fin set 21 to sleeve the first heat pipes 111 and the second heat pipes 112. The overall height of the first fin set 21 is lower than the heights of the first heat pipes 111 and the second heat pipes 112, such that the first fin set 21 can only cover the portions of the first heat pipes 111 and the second heat pipes 112 that are in proximity to the vapor chamber unit 10 and partially expose the portions of the first heat pipes 111 and the second heat pipes 112 that are far away from the vapor chamber unit 10. In an embodiment, the direction in which the fins of the first fin set 21 are arranged is perpendicular to the direction in which the first heat pipes 111 and the second heat pipes 112 are extended from the outer surface 1011. In other words, the fins of the first fin set 21 are perpendicularly disposed on the outer surface 1011 of the vapor chamber unit 10, such that the holes 211 are formed by the gaps among the arrangements of the fins, and the cross-sectional shapes of the holes 211 are generally square. However, the present disclosure is not limited as such.

In an embodiment, the cross-sectional areas of the holes 211 of the first fin set 21 are greater than the cross-sectional areas of the pipe bodies of the first heat pipes 111 (e.g., pipe bodies 1111 of the first heat pipes 111) and the second heat pipes 112, such that the pipe bodies of the first heat pipes 111 and the second heat pipes 112 in the holes 211 are free from being contacted with the first fin set 21, but the present disclosure is not limited as such.

In an embodiment, the second fin set 22 includes a second primary fin set 221 and a second secondary fin set 222. The second primary fin set 221 is stacked on the first fin set 21, and the second secondary fin set 222 is stacked on the second primary fin set 221. The second primary fin set 221 includes a plurality of holes 2211 penetrating through the two sides of the second primary fin set 221 to sleeve the first heat pipes 111 and the second heat pipes 112. The overall height of the second primary fin set 221 and the first fin set 21 is the same as the heights of the second heat pipes 112, such that the second primary fin set 221 can completely cover the portions of the second heat pipes 112 that are exposed from the first fin set 21, so that the second heat pipes 112 are free from being protruded from the top surface of the second primary fin set 221. However, since the first heat pipes 111 are higher than the second heat pipes 112, so the second primary fin set 221 can only partially cover portions of the first heat pipes 111 that are exposed from the first fin set 21 and still expose the remaining portions of the first heat pipes 111.

The second secondary fin set 222 also includes a plurality of holes 2221 penetrating through the two sides of the second secondary fin set 222. Since the portions of the second heat pipes 112 exposed from the first fin set 21 have already been completely covered by the second primary fin set 221, so there is no need to provide holes in the second secondary fin set 222 at locations corresponding to the second heat pipes 112, only holes 2221 at locations corresponding to the first heat pipes 111 are needed. After the second secondary fin set 222 is stacked on the second primary fin set 221, the second secondary fin set 222 can partially cover the portions of the first heat pipes 111 that are exposed from the second primary fin set 221. In an embodiment, the second secondary fin set 222 can completely cover the portions of the first heat pipes 111 that are exposed from the second primary fin set 221, such that the first heat pipes 111 are free from being protruded from the top surface of the second secondary fin set 222. Alternatively, the second secondary fin set 222 can partially cover the portions of the first heat pipes 111 that are exposed from the second primary fin set 221, such that the first heat pipes 111 protrude out of the top surface of the second secondary fin set 222. However, the present disclosure is not limited to as such.

In an embodiment, the fins of the second primary fin set 221 and the second secondary fin set 222 are arranged in the same direction parallel to the direction in which the first heat pipes 111 and the second heat pipes 112 extend from the outer surface 1011. In other words, the fins of the second fin set 22 are provided horizontally on the outer surface 1011 of the vapor chamber unit 10, so the holes 2211 and 2221 are formed by penetrating through each of the fins in the second primary fin set 221 and the second secondary fin set 222. The cross-sectional shapes of the holes 2211 and 2221 are generally circular or in conformity to the cross-sectional shapes of the first and second heat pipes 111 and 112, but the present disclosure is not limited as such.

As can be seen from the above, the arrangement direction of the fins of the first fin set 21 is different from the arrangement direction of the fins of the second fin set 22. However, the present disclosure does not require the directions in which the fins of the first and second fin sets 21 and 22 are arranged to be at a right angle to each other, and can be adjusted to other angles depending on the needs as long as the fins of the first and second fin sets 21 and 22 are arranged in different directions to each other.

In an embodiment, the thickness of the first fin set 21 extending from the outer surface 1011 of the vapor chamber unit 10 is greater or less than the thickness of the second fin set 22 stacked on the first fin set 21. The ratio of the thickness of the first fin set 21 extending from the outer surface 1011 of the vapor chamber unit 10 to the thickness of the second fin set 22 stacked on the first fin set 21 is 7:3 or 3:7, but the present disclosure is not limited as such.

Figure 4:
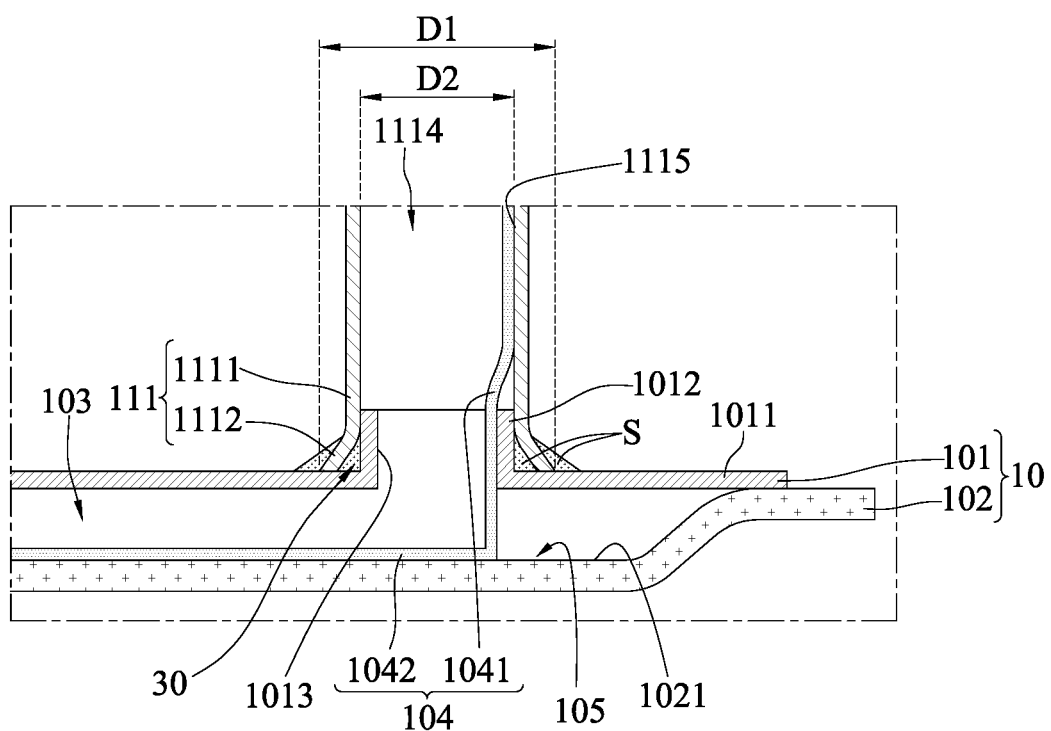
FIG. 4 is a schematic cross-sectional view of one pipe of the heat pipe set and a vapor chamber unit in the heat dissipation device in accordance with the present disclosure.

Referring to FIGS. 3 and 4, FIG. 4 is a schematic partial cross-sectional view illustrating a junction between a first heat pipe 111 and the vapor chamber unit 10 shown in FIG. 3. The following descriptions are set forth using a single first heat pipe 111 for illustrative purposes, the rest of the first heat pipes 111 and the plurality of the second heat pipes 112 have the same structures and will not be further illustrated.

As shown in FIG. 3, the first heat pipe 111 includes a pipe body 1111 and an open end 1112 and a closed end 1113 at two opposite ends of the pipe body 1111. As shown in FIG. 4, at least one connector 1012 is provided on the outer surface 1011 of the vapor chamber unit 10 for connecting with the open end 1112. The vapor chamber unit 10 can include a top board 101 and a bottom board 102. When the top board 101 and the bottom board 102 are assembled together, a chamber 103 can be formed therein. An outer surface 1011 of the top board 101 is provided with the connector 1012. The connector 1012 includes an opening 1013 that is in communication with the chamber 103. The amount of connectors 1012 can correspond to the amount of the first heat pipes 111 and the second heat pipes 112. An internal pipe space 1114 is formed in the pipe body 1111, and the open end 1112 of the pipe body 1111 can be connected with the connector 1012, such that the internal pipe space 1114 is in communication with the chamber 103 via the open end 1112 and the opening 1013 of the connector 1012.

In an embodiment, the open end 1112 extends axially along as well as radially outwards from the pipe body 1111, so the open end 1112 resembles the shape of a trumpet, and the aperture D1 of the open end 1112 can be greater than the aperture D2 of the connector 1012. Such a structure allows a conical space 30 to be formed between the open end 1112, the connector 1012 and the outer surface 1011 after the open end 1112 is connected to the connector 1012 and contacting the outer surface 1011 of the vapor chamber unit 10. In addition, the inner diameter of the pipe body 1111 is equivalent to the aperture D2 of the connector 1012, and the length of the connector 1012 protruding from the outer surface 1011 is greater than the length of the open end 1112, such that after the open end 1112 is connected to the connector 1012, the end of the connector 1012 can be wedged into the pipe body 1111, thereby securing the first heat pipes 111 and the second pipes 112 on the outer surface 1011 of the vapor chamber unit 10.

In an embodiment, in order to enhance the stability of the first and second heat pipes 111 and 112 on the outer surface 1011 and the effectiveness of the seal between the chamber 103 and internal pipe space 1114, a solder joint S can be filled in the conical space 30, as well as around the outer periphery of the open end 1112 and on the outer surface 1011 of the vapor chamber unit 10 to seal the junction between the open end 1112 and the connector 1012. In the embodiment above, a soldering material is used to join the first heat pipes 111, the second heat pipes 112 and the vapor chamber unit 10; however, in other embodiments, the vapor chamber unit 10, the first heat pipes 111 and the second heat pipes 112 can be integrally formed, and the present disclosure is not limited as such.

In an embodiment, a capillary structure 104 can be further provided in the first heat pipes 111, the second heat pipes 112 and the vapor chamber unit 10. The capillary structure 104 can be located in the internal pipe space 1114 of the pipe body 1111 and extends into the chamber 103 through the opening 1013 inside the connector 1012. The capillary structure 104 includes a first segment 1041 and a second segment 1042. The first segment 1041 is firmly or not firmly attached onto the inner surface 1115 of the pipe body 1111, and one end of the first segment 1041 extends into the chamber 103 through the opening 1013 inside the connector 1012. Once the end of the first segment 1041 extends into the chamber 103 and contacts the inner surface 1021 of the bottom board 102, the end of the first segment 1041 bends and extends to form the second segment 1042. The second segment 1042 is firmly attached to the inner surface 1021 of the bottom board 102 in the chamber 103. In an embodiment, the first segment 1041 and the second segment 1042 of the capillary structure 104 are perpendicular to each other, but the present disclosure is not limited to as such.

In an embodiment, a plurality of fluid channels 105 can be formed on the inner surface 1021 of the bottom board 102, and the second segment 1042 of the capillary structure 104 is firmly attached on the plurality of fluid channels 105. The plurality of fluid channels 105 can be regarded as capillary layers for filling a working fluid. For example, the fluid channels 105 can be formed from sintered bodies, metal mesh bodies, grooves, or a combination of the above, wherein sintered bodies refer to structures with multiple pores or interconnected holes formed by sintering metal powder; metal mesh bodies refer to woven meshes having multiple meshes formed by metal weaving; grooves refer to a plurality of interconnected grooves formed from gaps between a plurality of columns that are etched into the inner surface 1021 of the bottom board 102 by wet etching the inner surface 1021 of the bottom board 102. The capillary structures 104 are structures formed on the fluid channels 105, for example, the capillary structures 104 can be elongated structures made of fibers or the aforementioned metal mesh bodies. However, the present disclosure is not limited to as such.

In an embodiment, a working fluid can be filled in the chamber 103 of the vapor chamber unit 10 and the inner pipe space 1114 of the first and second heat pipes 111 and 112.

The working fluid can be guided by the capillary structure 104 or the fluid channels 105 to flow therein. For example, the working fluid in the chamber 103 can be distributed evenly in the chamber 103 by the second segments 1042 of the capillary structures 104, or can be concentrated above a heat source by the second segments 1042. When the heat dissipation device 1 of the present disclosure is in contact with a heat source, the liquid working fluid absorbs the heat energy generated by the heat source and becomes vaporized. The now gaseous working fluid can flow into the inner pipe space 1114 of the first and second heat pipes 111 and 112 via the openings 1013 of the connectors 1012. The gaseous working fluid is then cooled by the first fin set 21 and the second fin set 22 and condensed into liquid again, which can flow back into the chamber 103 through the first segments 1041 of the capillary structures 104 in the internal pipe space 1114 and is gathered or distributed evenly by the second segments 1042 of the capillary structures 104 for the next cooling circle.

In conclusion, with the special arrangements of the first fin set 21 and the second fin set 22 in the heat dissipation device 1 of the present disclosure, the distribution of the airflow field can be disrupted to increase the turbulence of the airflow field. This allows the chances of the airflow in contact with the cooling fins to be increased, thereby improving heat dissipation efficiency, and thus can be advantageous when applied to high power processors.

The above embodiments are provided for illustrating the principles and technical effects of the present disclosure, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A heat dissipation device, comprising:
   a vapor chamber unit;
   a heat pipe set provided on an outer surface of the vapor chamber unit;
   a first fin set provided on the outer surface of the vapor chamber unit and sleeving the heat pipe set; and
   a second fin set stacked on the first fin set and sleeving the heat pipe set,
   wherein an arrangement direction of fins of the first fin set is different from an arrangement direction of fins of the second fin set,
   wherein the heat pipe set includes a plurality of first heat pipes and a plurality of second heat pipes, wherein the plurality of first heat pipes are provided on the outer surface on two opposite ends of the vapor chamber unit, and the plurality of second heat pipes are provided on the outer surface between the two opposite ends of the vapor chamber unit,
   wherein the first fin set includes a plurality of holes penetrating through two sides of the first fin set to sleeve the plurality of first heat pipes and the plurality of second heat pipes, and wherein a cross-sectional area of each of the holes is greater than a cross-sectional area of a pipe body of each of the plurality of first heat pipes or each of the plurality of second heat pipes.

2. The heat dissipation device of claim 1, wherein heights of the plurality of first heat pipes extending from the outer surface are greater than heights of the plurality of second heat pipes extending from the outer surface.

3. The heat dissipation device of claim 1, wherein the first fin set partially covers and partially exposes the plurality of first heat pipes and the plurality of second heat pipes.

4. The heat dissipation device of claim 3, wherein the second fin set further includes a second primary fin set and a second secondary fin set stacked on the second primary fin set, wherein the second primary fin set completely covers portions of the plurality of second heat pipes exposed from the first fin set, and partially covers and partially exposes portions of the plurality of first heat pipes, and wherein the second secondary fin set partially or completely covers the portions of the plurality of first heat pipes exposed from the second primary fin set.

5. The heat dissipation device of claim 1, wherein each of the plurality of first heat pipes or the plurality of second heat pipes includes a pipe body and a closed end and an open end at two opposite ends of the pipe body, and wherein at least one connector is provided on the outer surface of the vapor chamber unit for connecting with the open end.

6. The heat dissipation device of claim 5, further comprising a chamber formed inside the vapor chamber unit, and an internal pipe space formed inside the pipe body, wherein the internal pipe space is in communication with the chamber through the open end and the connector.

7. The heat dissipation device of claim 6, further comprising a capillary structure located in the internal pipe space and extending into the chamber via an inner side of the connector.

8. The heat dissipation device of claim 7, wherein the capillary structure includes a first segment and a second segment, and wherein the first segment is located in the internal pipe space, and the second segment is formed by bending and extending one end of the first segment and is located in the chamber.

9. The heat dissipation device of claim 7, further comprising a working fluid filled in the chamber and the internal pipe space, wherein the working fluid is guided by the capillary structure to flow in the capillary structure.

10. The heat dissipation device of claim 5, wherein the open end extends axially along and radially outwards from the pipe body, such that an aperture of the open end is greater than an aperture of the connector, and wherein a conical space is formed between the open end, the connector and the outer surface once the open end is connected to the connector and contacting the outer surface of the vapor chamber unit.

11. The heat dissipation device of claim 10, further comprising a solder joint filled in the conical space to seal a junction between the open end and the connector.

12. The heat dissipation device of claim 1, wherein the vapor chamber unit and the heat pipe set are integrally formed.

13. The heat dissipation device of claim 1, wherein a thickness of the first fin set extending from the outer surface of the vapor chamber unit is greater or less than a thickness of the second fin set stacked on the first fin set.

* * * * *